US007221175B2

(12) United States Patent
Ramamoorthi (10) Patent No.: US 7,221,175 B2
(45) Date of Patent: May 22, 2007

(54) SELF-ALIGNING DOCKING SYSTEM FOR ELECTRONIC DEVICE TESTING

(75) Inventor: Ramesh Ramamoorthi, Singagpore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 10/908,433

(22) Filed: May 11, 2005

(65) Prior Publication Data

US 2006/0255820 A1    Nov. 16, 2006

(51) Int. Cl.
*G01R 31/02* (2006.01)
(52) U.S. Cl. .................................. 324/758
(58) Field of Classification Search ............ 324/754, 324/761, 762, 765, 158.1, 758
See application file for complete search history.

(56) References Cited

U.S. PATENT DOCUMENTS 6,377,062 B1*  4/2002  Ramos et al. ............... 324/758
2004/0018048 A1*  1/2004  Sausen ....................... 403/316

* cited by examiner

*Primary Examiner*—Ha Tran Nguyen
*Assistant Examiner*—Tung X. Nguyen
(74) *Attorney, Agent, or Firm*—Mikio Ishimaru (57) ABSTRACT

A system for docking a device handler for an electrical device with a test head includes providing a device handler for holding the electrical device, the device handler having a plurality of docking pins. A test head having a plurality of docking modules mounted thereon is provided. The plurality of docking pins is aligned with the plurality of docking modules. The plurality of docking pins is inserted into the plurality of docking modules. The plurality of docking pins is secured in the plurality of docking modules in a docked position to connect the device handler to the test head.

8 Claims, 12 Drawing Sheets

SELF-ALIGNING DOCKING SYSTEM FOR ELECTRONIC DEVICE TESTING

TECHNICAL FIELD

The present invention relates generally to the fabrication and the testing of integrated circuits (IC), and more particularly, to a docking system that is used to dock a device handler with a test head for testing electronic devices.

BACKGROUND ART

In the automatic testing of electronic devices, such as semiconductors or integrated circuits (IC), special device handlers are used to place the device that is to be tested in position for testing. The electronic testing itself is provided by a large and sophisticated automatic testing system that includes a test head. The test head is required to connect to and dock with a device handler. In such testing systems, the test head is usually very heavy. The reason for this heaviness is that the test head uses high-speed electronic timing signals generated by electronic test circuits, which must be located as close as possible to the device under test. Accordingly, the test head is packaged with electronic circuits in order to achieve high speed testing of state of the art devices.

Existing systems provide a manipulator or positioner that readily and accurately moves the heavy test head in position with respect to the device handler mechanism. The user typically must move the heavy device handler or the heavy positioner in order to provide alignment. When the test head is accurately in position with respect to the device handler, the test head and device handler are said to be aligned. After the test head and the device handler have been aligned, the test head and the device handler electrical connections can be brought together, or docked, thereby enabling the transfer of test signals between the test head and the device handler. Prior to docking, the test head and the device handler electrical connections must be precisely aligned to avoid damaging the electrical connections.

In a typical operational environment that performs electrical testing of ICs, the test head is guided manually to connect delicate electrical pins to a contacting plate of the device handler, without making use of alignment guides. After the test head has been positioned in the location where the test head can be connected and docked with the device handler, the test head is locked or kept level by means of a device manipulator. This often presents problems during production testing. For instance, the position of the test head can change causing the electrical connections with the device handler to be interrupted. The device handler also can vibrate causing intermittent electrical connections between the test head and the device handler, or even causing damage to the electrical equipment.

Due to the complexity and density of advanced, sophisticated ICs, the number of connections that must be provided to the IC during testing can be very large resulting in a heavy cable that is connected to the device under test. The heavy cable provides increased weight and mass that further aggravates the problem of establishing and maintaining secure positioning between the test head and the device handler.

Special arrangements typically are provided for the heavy interconnect cable. Some proposed solutions attempt to be able to position the test head into the desired position without interference by the cable by providing flexibility in positioning of the test head without interference by the heavy cable. Such arrangements avoid interference of the cable with the freedom of movement that must by provided to the operator of the test equipment while keeping the length of the cable at a minimum to avoid negative electrical performance during testing that can be introduced as a consequence of using a long electrical path to the device under test. Such proposed solutions also must maintain mechanical stability of the combined and interlocked device handler and test head to avoid the need for mechanical counterbalancing arrangements, and the like.

Existing systems and methods of positioning the test head with respect to the device handler frequently use lead screws and sliding/rotating mechanisms of various designs that align the test head with respect to the device handler. The positioning mechanisms also frequently are aided by electrical motors that provided three-dimensional degrees of movement in addition to rotational movement of the components of the test assembly. The various motions that are provided in this manner are however difficult to control to the required degree of accuracy leading to potential damage to the device under test or the electrical pins in the test head that are typically delicate and therefore easily damaged. The use of electrical motors and the like further require extensive floor space and therefore add to the complexity and size of the test system.

Additionally, IC testing often occurs in a clean room environment. Usable space within a clean room environment usually involves considerable expense in providing the clean room environment, further emphasizing the need for test components that are simple in design and sturdy in their application. Thus, where this ability to perform device testing in clean room environment is required, complex systems needing extensive floor space adds significant expense to the systems that are required for device testing.

Solutions to these problems have been long sought but prior developments have not taught or suggested any solutions and, thus, solutions to these problems have long eluded those skilled in the art.

DISCLOSURE OF THE INVENTION

The present invention provides a system for docking a device handler for an electrical device with a test head that includes providing a device handler for holding the electrical device, the device handler having a plurality of docking pins. A test head having a plurality of docking modules mounted thereon is provided. The plurality of docking pins is aligned with the plurality of docking modules. The plurality of docking pins is inserted into the plurality of docking modules. The plurality of docking pins is secured in the plurality of docking modules in a docked position to connect the device handler to the test head.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the apparatus, regardless of its orientation. The term "vertical" refers to a direction perpendicular to the horizontal as just defined. Terms, such as "on", "above", "below", "bottom", "top", "side", "higher", "lower", "over", and "under", are defined with respect to the horizontal plane.

Figure 1:
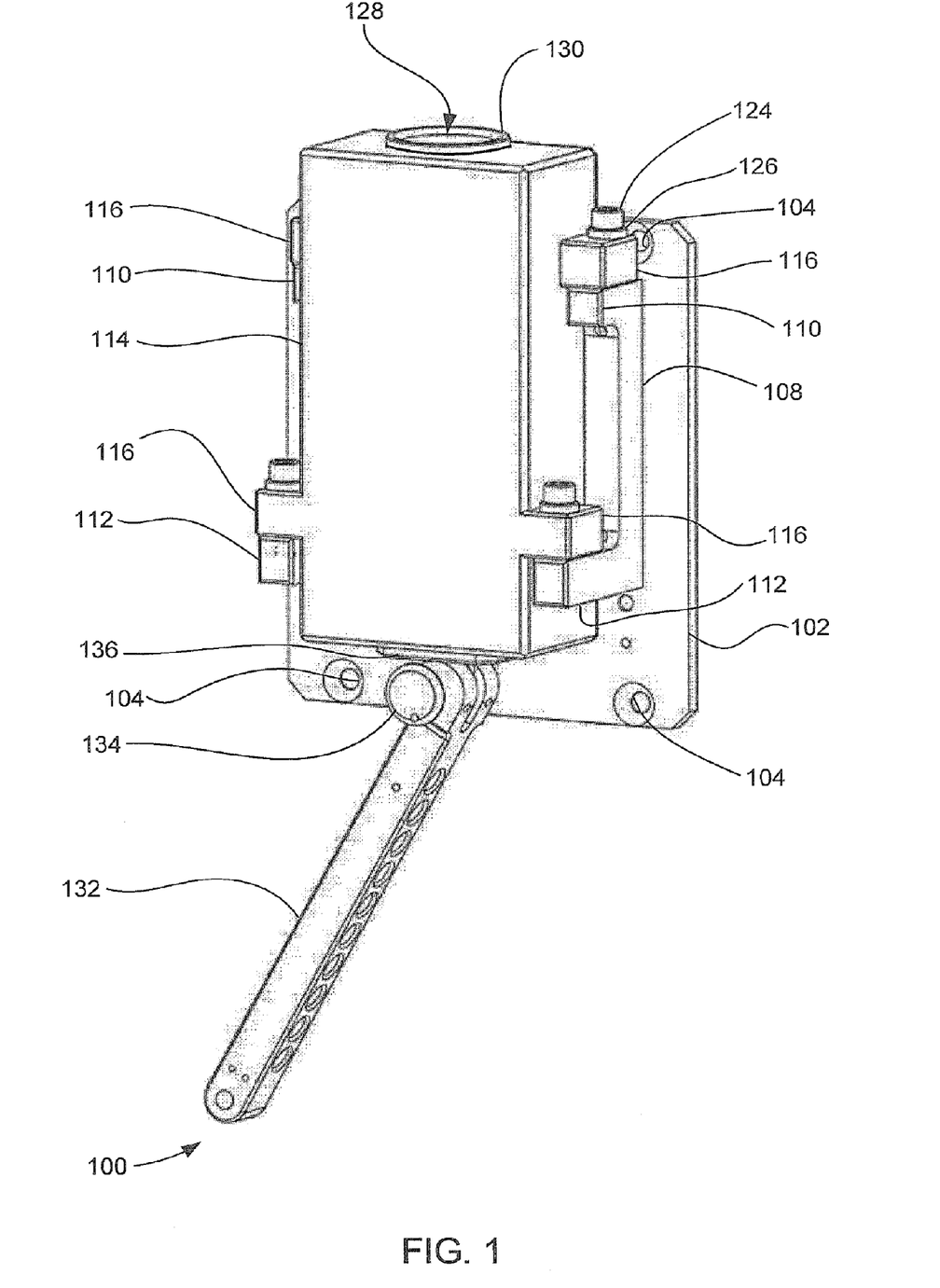
FIG. 1 is an isometric view of a docking module manufactured in accordance with an embodiment of the present invention.

Referring now to FIG. 1, therein is shown an isometric view of a docking module 100 manufactured in accordance with an embodiment of the present invention. The docking module 100 includes a base plate 102 having two parallel surfaces. The base plate 102 has a number of mounting holes 104 for attaching the base plate to a tester (not shown). The base plate 102 also has a guide-pin hole 106. The base plate 102 has a pair of brackets 108 attached to the base plate 102. Each of the pair of brackets 108 has an upper step 110 and a lower step 112. The lower steps 112 typically extend away from the base plate 102 about twice as much as the upper steps 110. The upper surfaces of the upper steps 110 and the lower steps 112 have tap holes (not shown) formed therein typically by machining. The pair of brackets 108 are mounted evenly spaced horizontally from the vertical centerline of the base plate 102. The top surfaces of the pair of brackets 108 are leveled with respect to the horizontal plane of the base plate 102.

The docking module 100 also includes a module housing 114. A number of mounting ears 116 having clearance holes (not shown) extend outwardly from the module housing 114 in substantial vertical alignment with the upper steps 110 and the lower steps 112 on each of the pair of brackets 108. The mounting ears 116 are spaced evenly apart from each other in the X, Y, and Z directions from the center of the module housing 114. When the module housing 114 is mounted on the pair of brackets 108, the mounting ears 116 seat on the upper surfaces of the upper steps 110 and the lower steps 112. A captive screw 124 with a washer 126 are mounted through the clearance hole of the each of the mounting ears 116 into the tap holes in the upper steps 110 and the lower steps 112. The module housing 114 typically is slightly movable in the X and Y direction on the upper steps 110 and the lower steps 112 on each of the pair of brackets 108 to provide alignment flexibility when installing the docking module 100 to the intended test head docking location before tightening the captive screw 124, as discussed below. For example, it has been discovered that movement of about two millimeters in each direction provides suitable flexibility for this purpose.

A guide-pin hole 128 is in the top surface of the module housing 114. A guide-pin bushing 130 is positioned in the guide-pin hole 128. Typically, some portion of the guide-pin bushing 130 extends above the upper surface of the module housing 114. The mounting ears 116 extend outward substantially perpendicular to the center axis of the guide-pin bushing 130.

The docking module 100 also has a cam lever 132 connected (as better shown in FIG. 3) below using a cam retainer plug 134. A cam lever plate 136 is positioned on the bottom surface of the module housing 114 between the cam lever 132 and the lower surface of the module housing 114.

Figure 2:
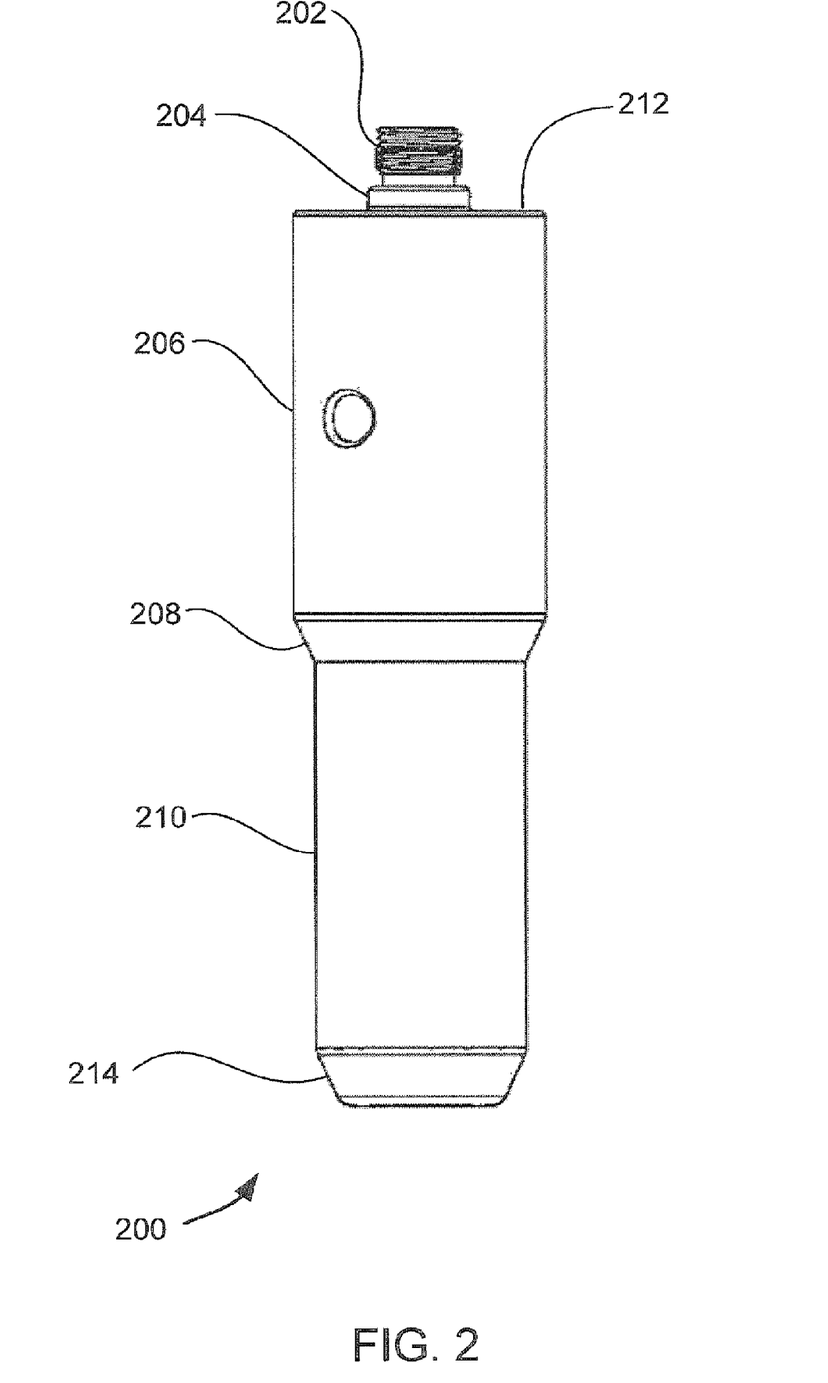
FIG. 2 is a side view a side view of a docking pin.

Referring now to FIG. 2, therein is shown a side view of a docking pin 200. The docking pin 200 includes a threaded diameter 202 connected to a pivoted diameter 204. The docking pin 200 also has a locating diameter 206 and a pilot diameter 210. The pilot diameter 210 typically has about a 0–1 degree negative taper towards a junction point 208 of the pilot diameter 210 and the locating diameter 206. A horizontal surface 212 located between the pivoted diameter 204 and the locating diameter 206 is perpendicular to the vertical axis of the locating diameter 206 of the docking pin 200.

The end of the locating diameter 206 and the starting point of the pilot diameter 210 are smoothly tapered for smooth guiding of the docking pin 200. Preferably, the junction point 208 is maintained at the same distance from the horizontal face 212 in all docking pins. The pilot diameter 210 is smaller than the locating diameter 206 and closest to a spring collet-holding diameter 214. The threaded diameter 202, the pivoted diameter 204, the locating diameter 206, and the pilot diameter 210 are substantially aligned to a single axis.

Figure 3:
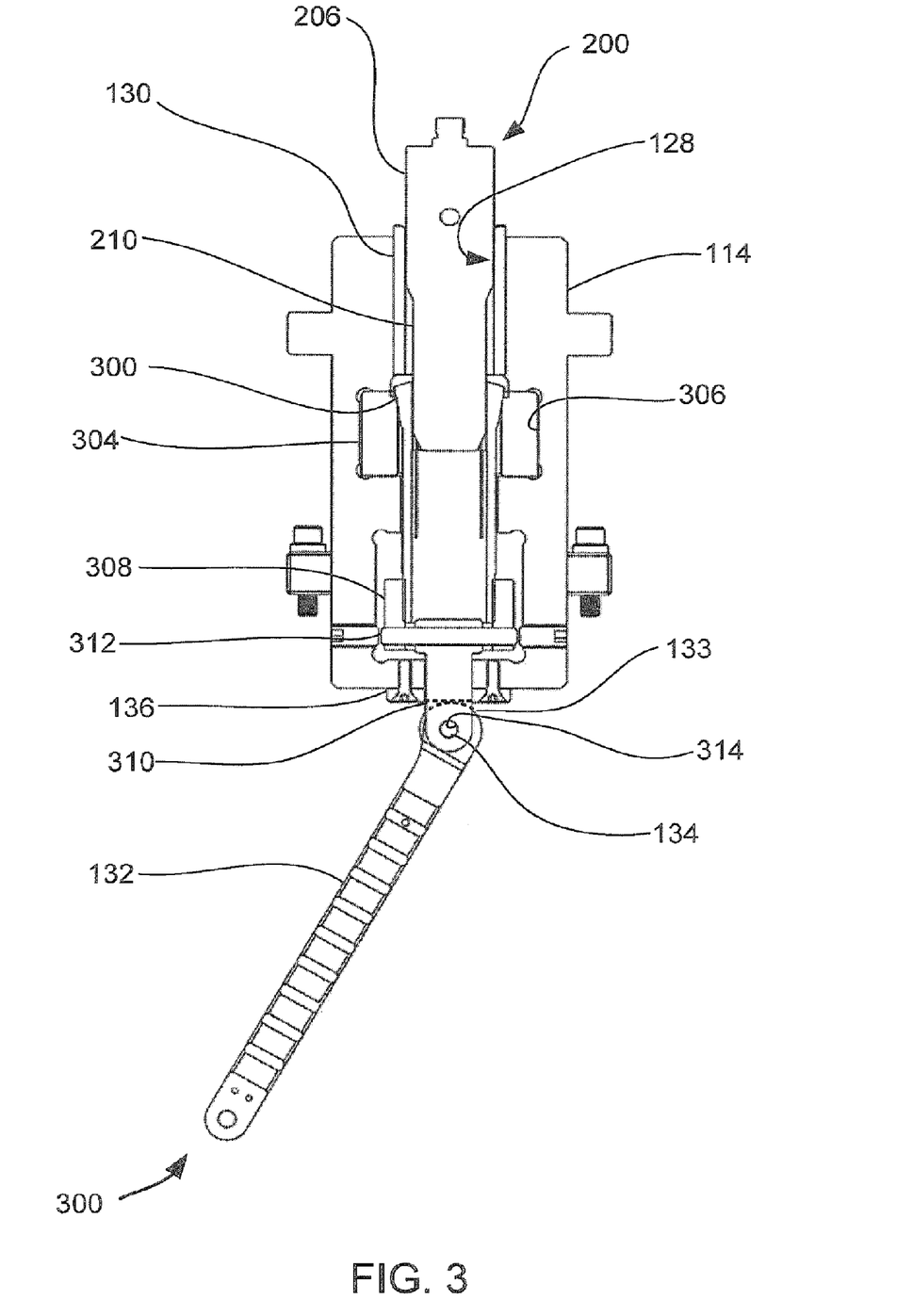
FIG. 3 is a cross-sectional view of the internal components that are part of the docking module shown in FIG. 1 and the docking pin shown in FIG. 2.

Referring now to FIG. 3, therein is shown a cross-sectional view of the internal components that are part of the docking module 100 shown in FIG. 1 and the docking pin 200 shown in FIG. 2. The docking module 100 includes the module housing 114. The guide bushing 130 is press fitted into the guide-pin hole 128 to accommodate the locating diameter 206 of the docking pin 200 with standard machining tolerances.

A spring collet 300 has an outside taper and is mounted so the external body of the spring collet 300 is seated in a collet housing 304. Downward movement of the spring collet 300 causes the taper to slide in the collet housing 304 to grip the docking pin 200. The collet housing 304 is positioned in a cavity pocket 306 inside the module housing 114 to align the axis of the spring collet 300 to the axis of the guide bushing 130. The collet housing 304 is designed to allow it to move about 0.50 mm in the X and Y direction inside the module housing 114 to facilitate alignment of the spring collet 300 to the pilot diameter 210 of the docking pin 200 during docking.

A puller block 308 is attached to a threaded outer diameter (OD) at the bottom of the spring collet 300. A connecting rod 310 is attached to the puller block 308 by means of a connecting pin 312. The opposite end of the connecting rod 310 is connected to the cam lever 132 through the cam lever plate 136. A hole 314 in the center of the connecting rod 310 typically is positioned so the hole 314 will be positioned the same distance below the cam lever plate 136 in each of the docking modules 100. The distance of the hole 314 below the cam lever plate 136 can be adjusted by adjusting the puller block 308 along the threaded OD of the spring collet 300.

The cam lever 132 is attached to the connecting rod 310 by using the cam retainer plug 134. The cam lever 132 preferably has a calculated length so the eccentric OD 133 of the cam lever 132 will touch the bottom surface of the cam lever plate 136 when the cam lever 132 is positioned at a predetermined angle, such as a 30-degree angle, from the vertical axis of the docking pin 200. The spring collet 300 thereby remains in an unlocked position to facilitate insertion of the pilot diameter 210 of the docking pin 200 into the guide-pin bushing 130 in the module housing 114 when there is no pull on the connecting rod 310.

During a docking process, the docking module 100 is moved upward to cause insertion of the pilot diameter 210 of the docking pin 200 into the guide-pin bushing 130 of the docking module 100. Further upward movement of the docking module 100 causes the locating diameter 206 of the docking pin 200 to enter the guide-pin bushing 130 of the docking module 100, and the pilot diameter 210 of the docking pin 200 to enter the spring collet 300. The docking pin 200 is maintained in a substantially vertical position due to the relatively small tolerance between the locating diameter 206 of the docking pin 200 and the inner diameter of the guide bushing 130 to minimize tilting of the docking pin 200.

After the docking pin 200 has reached a required length inside the module housing 114, the cam lever 132 is moved to a vertical position by applying a force to the cam lever 132. As the cam lever 132 moves to a vertical position, the eccentric OD 133 of the cam lever 132 rotates against the cam lever plate 136 and pulls the connecting rod 310 downward causing the spring collet 300 to slide down into the collet housing 304. The spring collet 300 is radially compressed against the pilot diameter 210 of the docking pin 200. The leverage force of the cam lever 132 is thereby converted to a high gripping force on the pilot diameter 210 of the docking pin 200 to prevent the docking pin 200 from pulling out of the module housing 114. The spring collet 300 can grip the pilot diameter 210 anywhere along its length thereby providing additional flexibility for accurate control of the height of the docking pin 200 without changing or adjusting any components.

Figure 4:
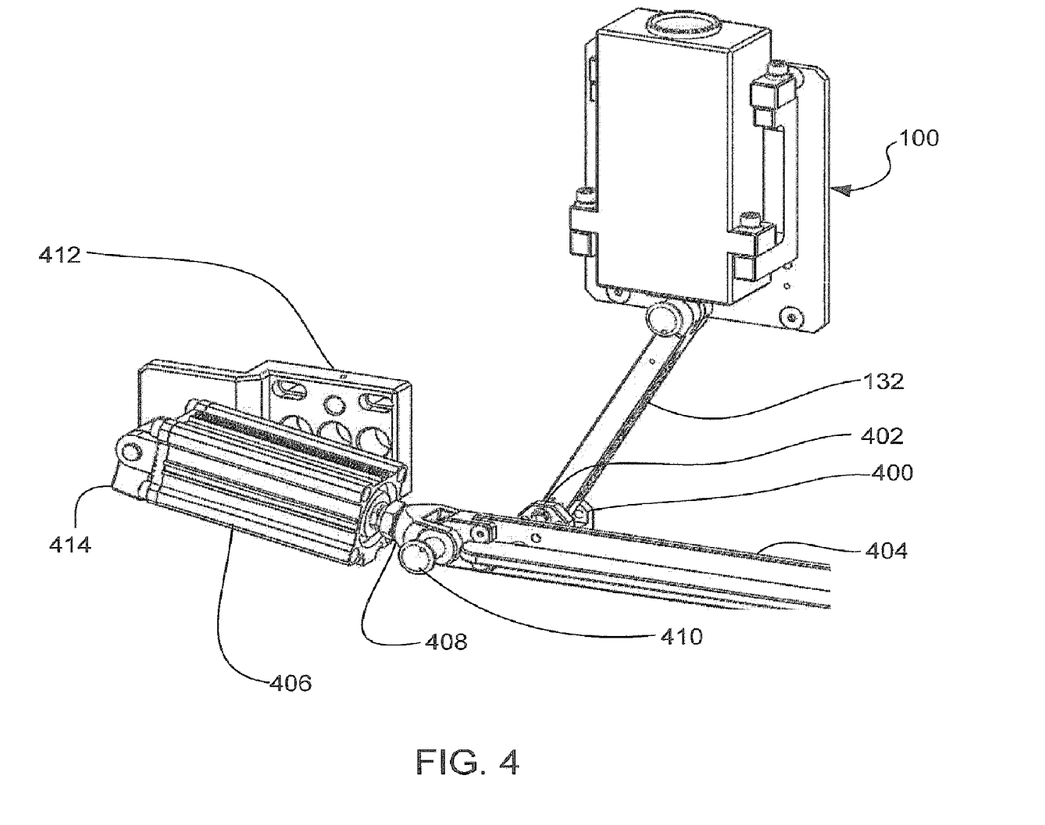
FIG. 4 is an isometric view of a docking module having its associated cam lever connected to a hinge block using a hinge pin.

Referring now to FIG. 4, therein is shown an isometric view of the docking module 100 having the cam lever 132 connected to a hinge block 400 using a hinge pin 402. The hinge block 400 is attached to a link bar 404. One end of the link bar 404 is attached to a pneumatic cylinder 406 using a U-joint 408. The link bar 404 is connected to the U-joint 408 using a retainer plug 410. The pneumatic cylinder 406 is attached to a cylinder base 412 using a pivot block 414. Operation of the pneumatic cylinder 406 exerts a force on the cam lever 132 through the link bar 404 to move the cam lever 132 to a vertical position.

Figure 5:
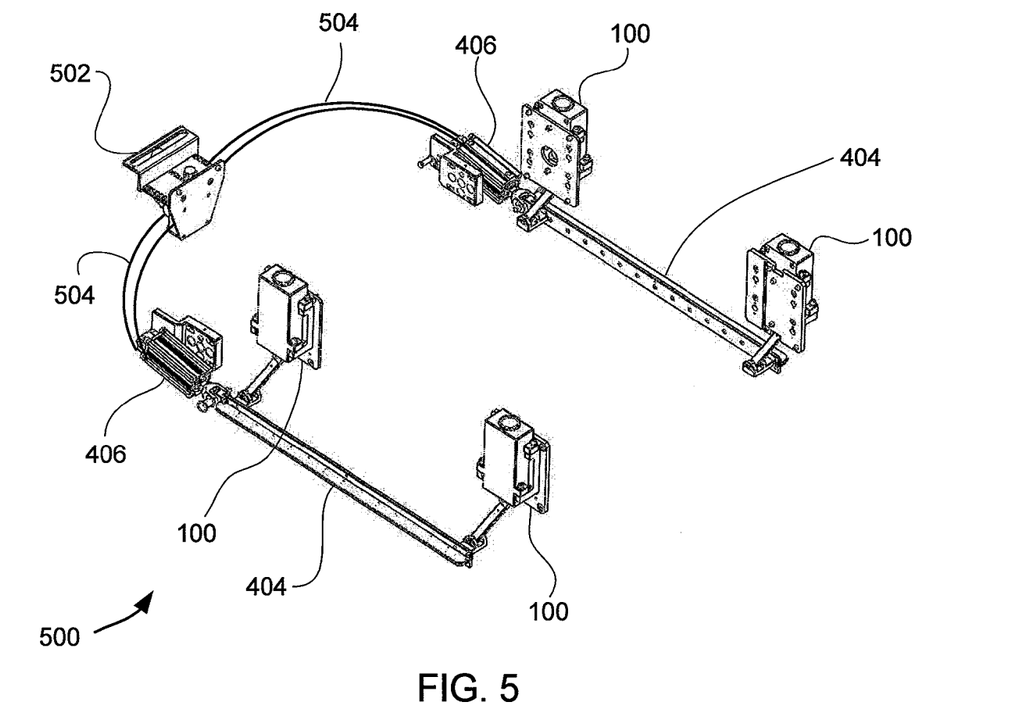
FIG. 5 is an isometric view of four docking modules and their respective cam levers connected to a link bar.

Referring now to FIG. 5, therein is shown four docking modules 100 and their respective cam levers 132 connected to a link bar system 500. A pneumatic control valve 502, such as a three-way pneumatic control valve, is connected to each of the pneumatic cylinders 406 using an array of pneumatic tubing 504. The pneumatic cylinder 406 is connected to the cam lever 132 of each of the docking modules 100 as shown in FIG. 4. The pneumatic cylinders 406, the docking modules 100, and the pneumatic control valve 502 are positioned to be connected to a test head (800 shown in FIG. 8).

When the pneumatic control valve 502 is in an un-dock position, the piston rod in each of the pneumatic cylinders 406 remains retracted inside the pneumatic cylinder 406. Each of the cam levers 132 remain at their pre-determined angle so each of the spring collets 300 are in an unlocked position ready to receive the docking pin 200 as shown in FIG. 3. When the pneumatic control valve 502 is in a docking position, the piston inside the pneumatic cylinder 406 is actuated and the piston rod pushes the link bar 404 forward to move each of the cam levers 132 into a vertical position thus operating all of the docking modules 100 at the same time.

Figure 6:
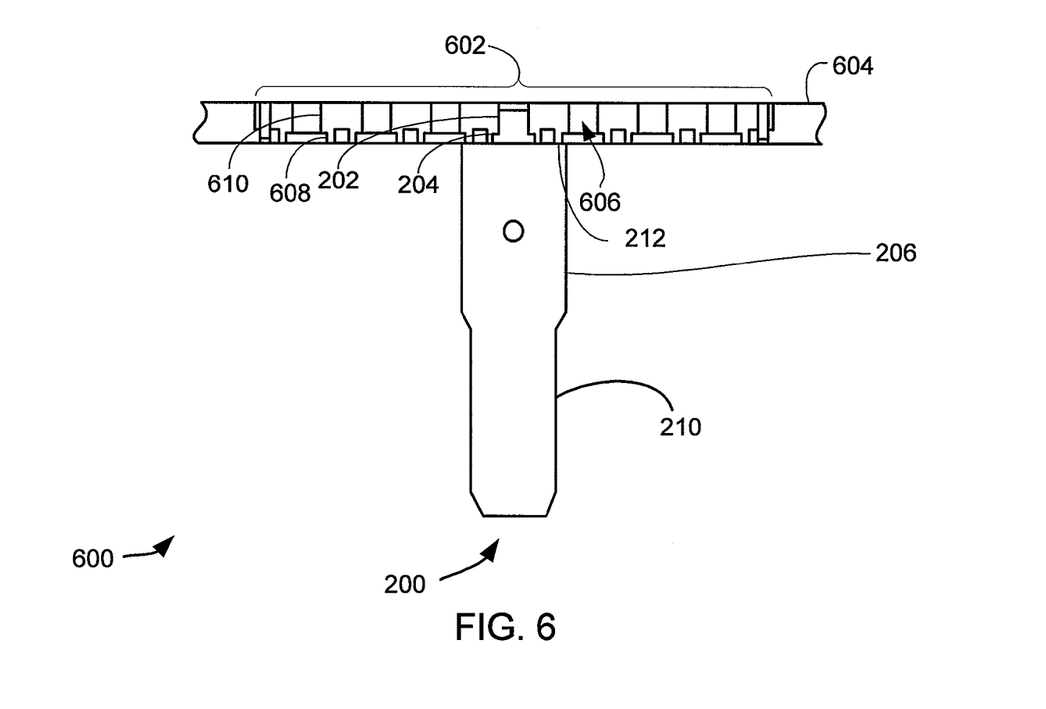
FIG. 6 is an isometric view of the main handler plate, pitching plate and a docking pin assembly.

Referring now to FIG. 6, therein is shown a cross-sectional view of a handler plate assembly 600 and docking pin 200. The handler plate assembly 600 includes a pitching plate 602 attached to a main handler plate 604. The pitching plate 602 typically is precisely assembled flush with the horizontal plane of the main handler plate 604 and the required distance from center of the main handler plate 604. The pitching plate 602 has one or more of a number of pitching holes 606 machined perpendicular to the surface of the pitching plate 602 in X and or Y direction depending upon the particular test site matrix to be used.

The number of pitching holes 606 includes a step locating hole 608 and a threaded hole 610 sharing the same axis. During installation of the docking pin 200 to the pitching plate 602, the threaded diameter 202 of the docking pin 200 is screwed into the threaded hole 610 and the pivoted diameter 204 of the docking pin 200 is guided into the step locating hole 608. Tightening of the docking pin 200 into the threaded hole 610 firmly seats the horizontal face 212 of the docking pin 200 against the pitching plate 602 to maintain the docking pin 200 in a vertical position substantially perpendicular to the pitching plate 602. The pivoted diameter 204 of the docking pin 200 typically is smaller than the diameter and depth of the step locating hole 608 so the docking pin 200 can be tightened with the horizontal surface 212 firmly seated against the pitching plate 602. The docking pin 200 can be tightened to any of the pitching holes 606 by hand without need of a special tool.

Figure 7:
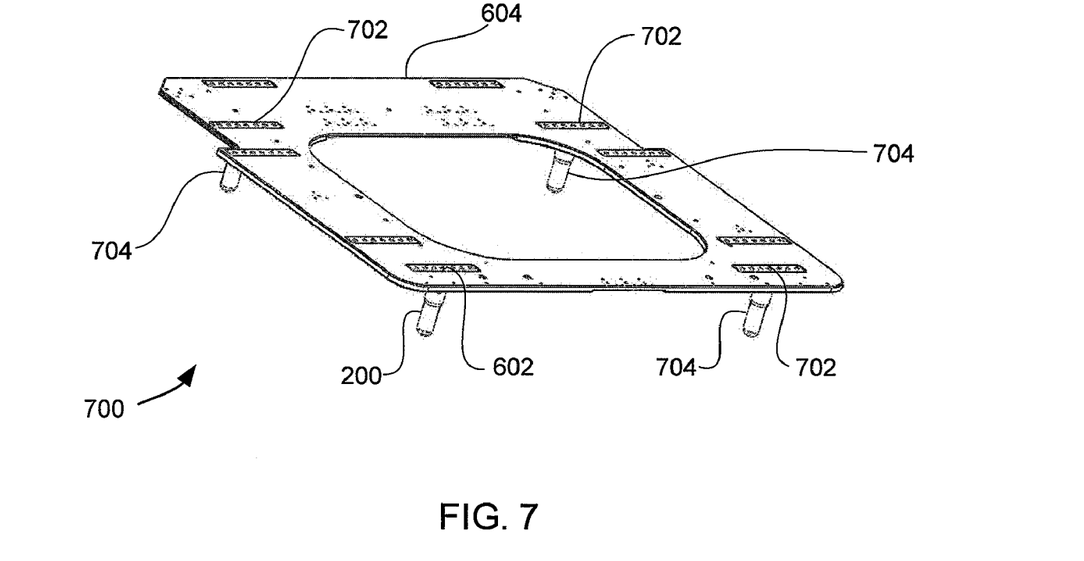
FIG. 7 is an isometric view of the main handler plate in more detail.

Referring now to FIG. 7, therein is shown an isometric view of a main handler plate assembly 700. The main handler plate assembly 700 includes the main handler plate 604 assembled with a number of pitching plates 702 and a number of docking pins 704. Each of the pitching plates 702 is constructed like the pitching plate shown in FIG. 6. Similarly, each of the docking pins 704 is constructed like the docking pin 200 shown in FIG. 2. The main handler plate 604 has pre-machined pockets on its horizontal surface to receive the pitching plates 702. The docking pins 704 are connected to several of the pitching plates 702 depending upon the individual tester docking orientation and number of module assemblies used for a particular tester.

Preferably, the location in the pitching plates 702 into which the number of docking pins 704 is positioned are engraved in the main handler plate 604 to allow the flexibility needed to use the main handler plate assembly 700 with multiple testers that utilize different docking locations and orientations. Changes can be accomplished by simply relocating the docking pins 704 to the respective pitching plates 702 in the designated pitching-hole locations and hand tightening the docking pins 704 without a need of an alignment jig. This will reduce setup changeover time by simply relocating the docking pins 704 to the exact pitching-hole locations in the pitching plates 702 required.

Figure 8:
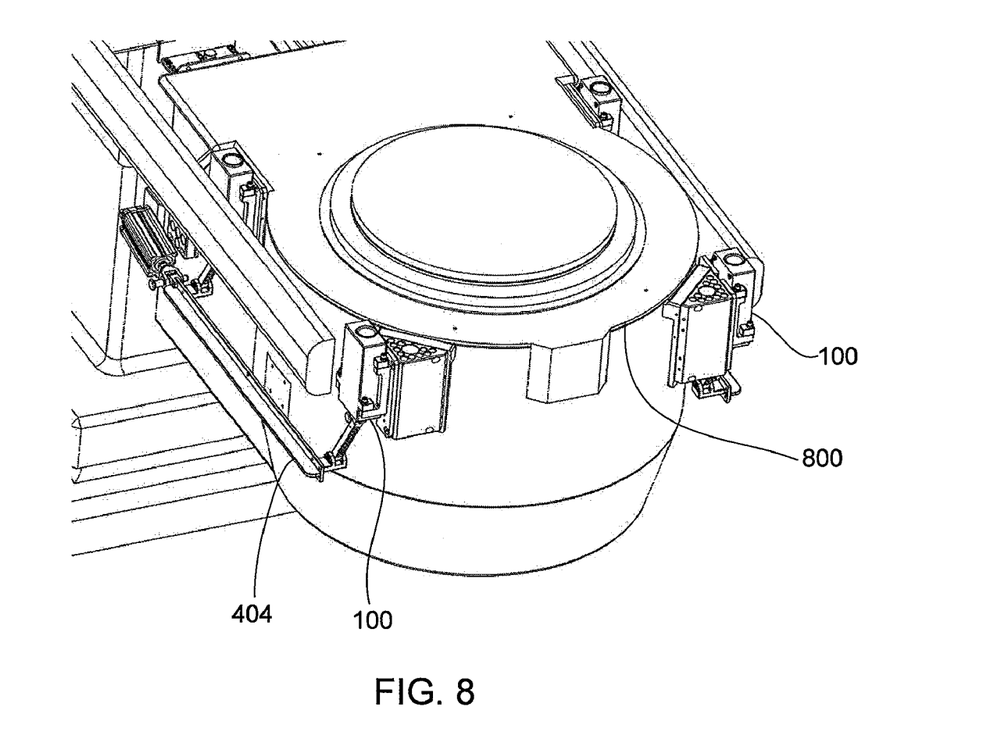
FIG. 8 is an isometric view of a test head that has four docking modules installed.

Referring now to FIG. 8, therein is shown an isometric view of a test head 800 that has four docking modules 100 installed. The docking modules 100 are connected by the link bar 404 as shown in FIG. 4. The four docking modules 100 form a rectangular or square pattern with respect to the orientation of the test head 800 depending upon the distance between each of the docking modules 100 from a center reference of the test head 800.

The docking modules 100 are aligned using an alignment jig (not shown) during installation so that the guide bushing 130 in each of the docking modules 100 is vertical to the horizontal plane of the tester and positioned an accurate distance from the center of the test head 800. Once correctly positioned with respect to the docking orientation reference of the test head 800, the docking modules 100 are secured to the test head 800. All the guide bushings 130 of the docking modules 100 are aligned in the same horizontal plane the required distance from top surface of the test head 800. The docking modules 100 do not require any further alignment or adjustment during setup change, Z height change, test site shifting, or handler change unless the docking modules 100 are removed from the test head 800.

Figure 9:
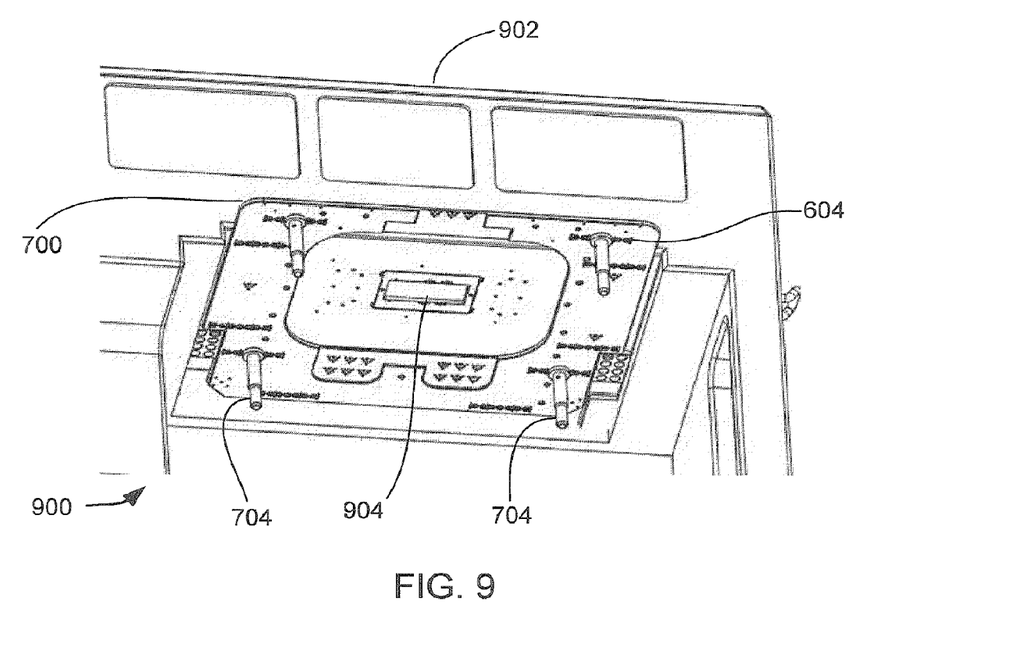
FIG. 9 is a an isometric bottom view of a main handler plate.

Referring now to FIG. 9, therein is shown an isometric bottom view of a handler 900. The handler 900 includes the main handler plate assembly 700 with four docking pins 200 that represent a particular tester docking orientation. The main handler plate assembly 700 is mounted to a handler base plate 902 and aligned using a handler alignment jig. The main handler plate assembly 700 is secured to the handler base plate 902, such as by using screws. The handler 900 has a handler electrical contact 904 that mates with a test head electrical contact (not shown) located in the center of the main handler plate assembly 700.

When the test head electrical contact (not shown) is located in the center of the test head (not shown), the handler 900 can be docked to the test head without any change in the location of the docking pins 200. When the test head electrical contact is offset from the center of the test head, the handler electrical contact 904 must be repositioned to connect with the offset test head electrical contact location.

In this case, the handler electrical contact 904 already was aligned to the center reference of the main handler plate assembly 700 using a handler alignment jig. Therefore, instead of moving the entire main handler plate assembly 700 and realigning it to the location of the offset test head electrical contact, the present invention allows repositioning of the handler electrical contact 904 by simply unscrewing the docking pins 200 from their current locations and hand tightening them in different locations in the appropriate pitching plates.

Since the location in the pitching plates 702 shown in FIG. 7 for the required offset of the docking pins 200 is known and identifiable, accurate positioning of the handler electrical contact 904 and tester electrical contact is obtained without the use of an alignment jig.

Figure 10:
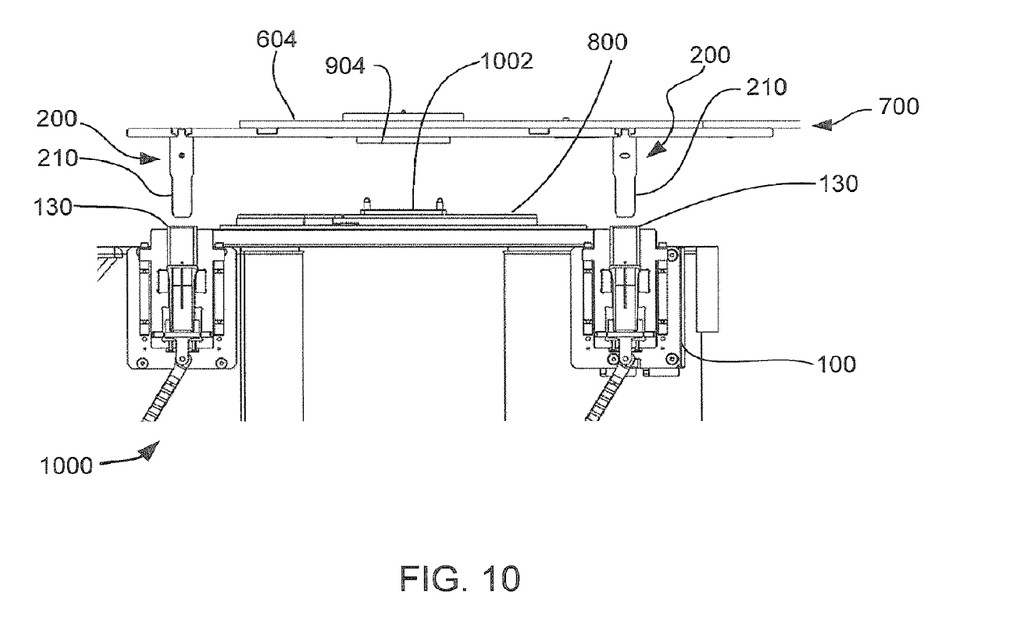
FIG. 10 is a cross-sectional view of a test head and the main handler plate during initial setup of a docking process.

Referring now to FIG. 10, therein is shown a cross-sectional view of a test head module assembly 1000 and the main handler plate assembly 700 during initial setup of a docking process. The pilot diameter 210 of each of the docking pins 200 is roughly aligned with the guide bushing 130 of the docking module 100.

The lower end of the pilot diameter 210 of each of the docking pins 200 is at the same level with respect to the upper edge of the respective ones of the guide bushings 130. Adjustment of this distance is achieved by adjusting the tumble and swing movement of the test head 800 while the handler electrical contact 904 and a test head electrical contact 1002 are separated and roughly aligned with each other.

Figure 11:
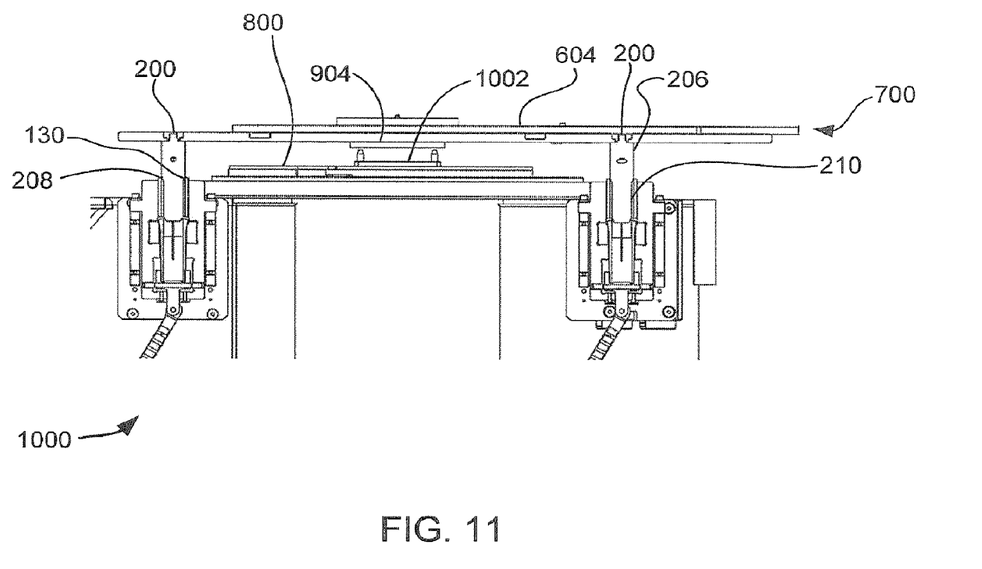
FIG. 11 is a cross-sectional view of the test head upon initiation of the docking process.

Referring now to FIG. 11, therein is shown a cross-sectional view of the test head module assembly 1000 upon initiation of the docking process. As the test head 800 and the main handler plate assembly 700 are moved toward each other, such as by manual or powered operation, the pilot diameter 210 of the docking pin 200 enters the guide bushing 130 in the docking module 100. A visual inspection is performed to determine that the junction point 208 of each of the docking pins 200 is at the same level with respect to the upper portion of the guide bushing 130.

Any necessary adjustment can be performed by adjusting the tumble and swing movement of the test head 800. The visual inspection will reveal that the test head 800 and the main handler plate assembly 700 are roughly parallel to each other in their appropriate position. The handler electrical contact 904 and the test head electrical contact 1002 are closely aligned to each other, but not engaged in FIG. 11.

Figure 12:
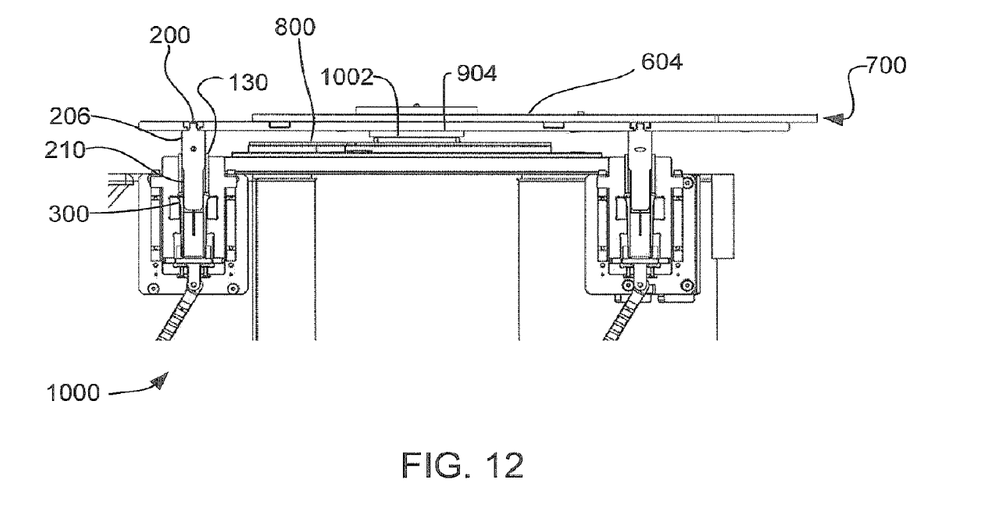
FIG. 12 is a side view of the test head upon further upward movement of the test head.

Referring now to FIG. 12, therein is shown a side view of the test head module assembly 1000 upon further movement of the test head 800 and the main handler plate assembly 700. The locating diameter 206 of the docking pin 200 enters the guide bushing 130. The pilot diameter 210 of the docking pin 200 enters the spring collet 300.

In this position, the locating diameter 206 of the docking pin 200 is positioned in the guide bushing 130 thereby maintaining the test head 800 and the main handler plate assembly 700 in parallel horizontal planes. The handler electrical contact 904 is aligned with the test head electrical contact 1002.

As the test head 800 and the main handler plate assembly 700 move further into engagement the handler electrical contact 904 and test head electrical contact 1002 are connected, but the main handler plate assembly 700 is not docked in the docking module 100.

Figure 13:
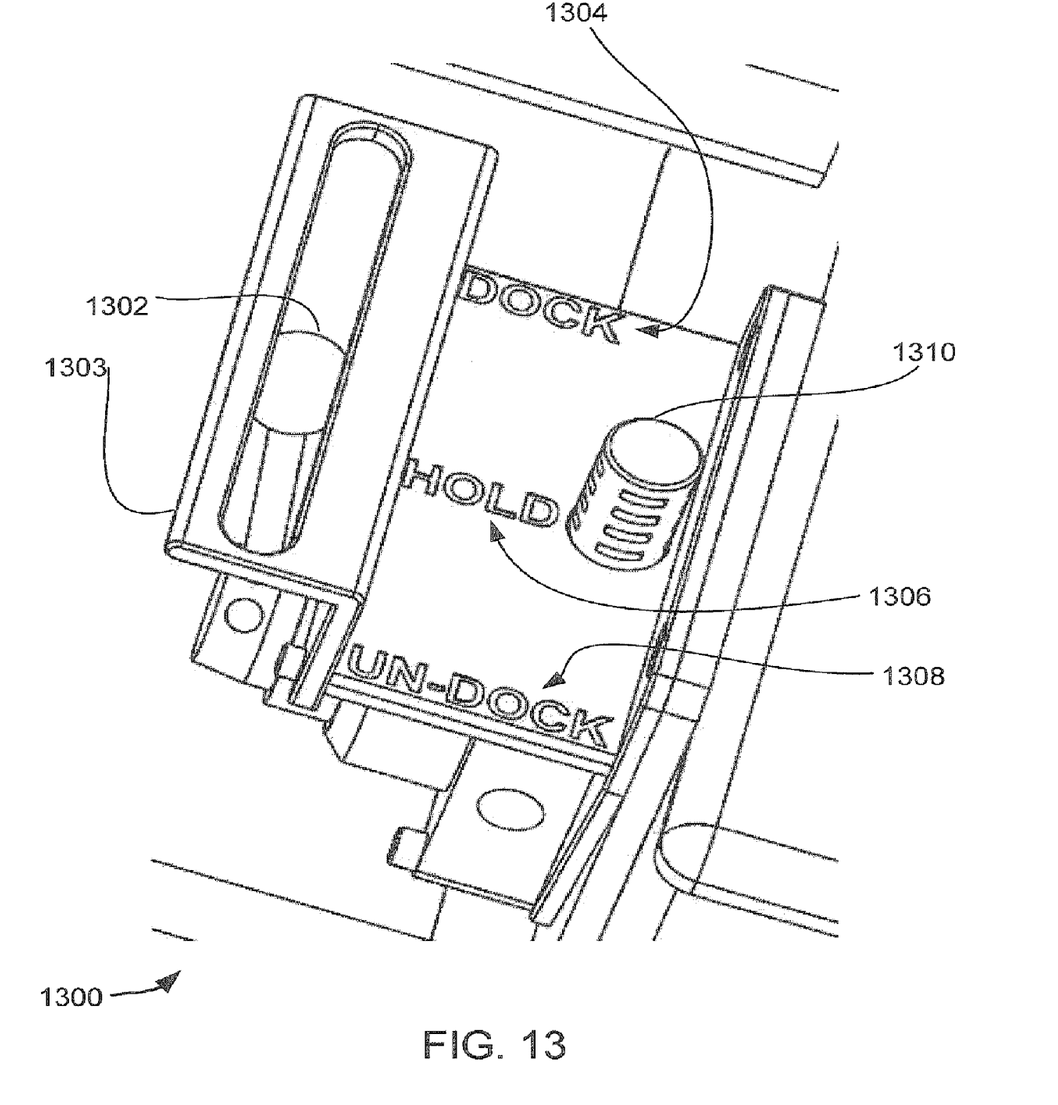
FIG. 13 is an isometric view of a pneumatic control valve assembly that is attached to the test head.

Referring now to FIG. 13, therein is shown an isometric view of a pneumatic control valve assembly 1300. A hand lever 1302 is provided with a protective cover 1303. The hand lever 1302 is movable into one of three positions respectively labeled DOCK 1304, HOLD 1306, and UN-DOCK 1308 to indicate the position of the hand lever 1302 during the docking and undocking process. A silencer 1310 is provided to muffle the sound of the high pressurized air release when the hand lever 1302 is moved to the UN-DOCK position 1308 during the undocking process.

Figure 14:
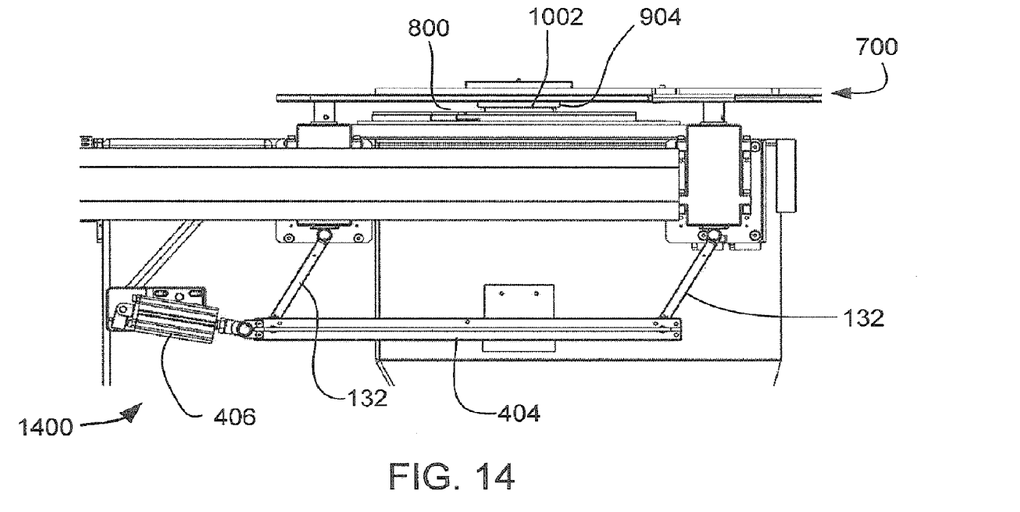
FIG. 14 is a side view of the test head upon further upward movement of the test head as shown in FIG. 12 with the location of the link bar.

Referring now to FIG. 14, therein is shown a side view of the test head module assembly 1000 upon further engagement of the test head 800 and the main handler plate assembly 700 as shown in FIG. 12 with the location of the link bar 404. When the hand lever 1302 is in the UN-DOCK position 1308 shown in FIG. 13 the piston rod is retracted inside the pneumatic cylinder 406 and each of the cam levers 132 remains at a 30-degree angle from vertical. In this position, the spring collet 300 shown in FIG. 12 is in an unlock position without gripping the pilot diameter 210 of the docking pin 200. Accordingly, the main handler plate assembly 700 is aligned, but remains in the undocked position.

Figure 15:
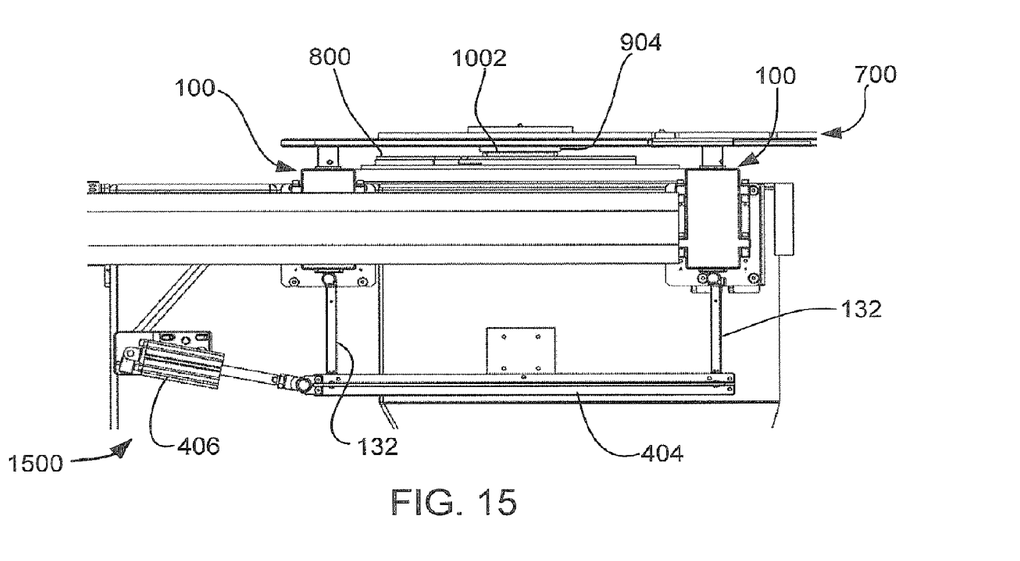
FIG. 15 is a side view of the test head upon further upward movement of the test head as shown in FIG. 12 with the location of the link bar in the docked position.

Referring now to FIG. 15, therein is shown a side view of the test head module assembly 1000 upon further engagement of the test head 800 and the main handler plate assembly 700 as shown in FIG. 12 with the location of the link bar 404 in the docked position. The hand lever 1302 in the pneumatic control valve assembly 1300 shown in FIG. 13 has been moved to the DOCK position 1304. The piston is activated inside the pneumatic cylinder 406 and the piston rod pushes the link bar 404 forward to synchronize the docking process at each of the docking modules 100 simultaneously.

As the link bar 404 moves forward in response to activation of the piston rod, the eccentric OD 133 of the cam lever 132 rotates against the cam lever plate 136 and pulls the connecting rod 310 downwards in each of the docking modules 100 simultaneously as shown an described above with reference to FIG. 3. Accordingly, the spring collet 300 slides down to the collet housing 304 causing the spring collet 300 to shrink and grip the pilot diameter 210 of the docking pin 200 in each of the docking modules 100 simultaneously.

The combined leverage forces from the pneumatic cylinder 406, the link bar 404, and the cam lever 132 creates a high gripping force so the spring collet 300 firmly grips the pilot diameter 210 of each of the docking pins 200 thereby preventing the docking pin 200 from pulling out of the docking module 100. The main handler plate assembly 700 is securely docked with respect to the test head 800.

The spring collet 300 can grip the pilot diameter 210 of the docking pin 200 anywhere along its length during docking to provide additional flexibility and accuracy between the test head 800 and the main handler plate assembly 700 by using the docking pin 200 without changing or adjusting any parts.

The hand lever 1302 in the pneumatic control valve assembly 1300 is moved to the HOLD position 1306, so that the air release valve in the pneumatic control valve assembly is blocked and the compressed air in the pneumatic cylinder 406 is arrested to maintain the piston rod at the extruded position. This prevents release from the docking position by accidental air supply cut-off to the pneumatic control valve assembly 1300. The docking between the main handler plate assembly 700 and the test head 800 has been accomplished and the handler and tester electrical contacts are securely positioned for device testing.

When undocking the main handler plate assembly 700 from the tester head 800, the hand lever 1302 in the pneumatic control valve assembly 1300 is moved to the UN-DOCK position 1308 so the compressed air in the piston area is released and the piston rod is pulled back. The cam lever 132 is moved back to a 30-degree angle from vertical. The spring collet 300 is released from the collet housing 304 and moves upward. The spring collet 300 expands and releases the gripping force around the pilot diameter 210 of the docking pins 200 simultaneously. The test head 800 now can be moved downward until the pilot diameter 210 of each of the docking pins 200 fully comes out of the test module 100.

The docking modules 100 can be arranged in a variety of orientations around a given test head 800 to accommodate the needs of a particular testing operation.

Figure 16:
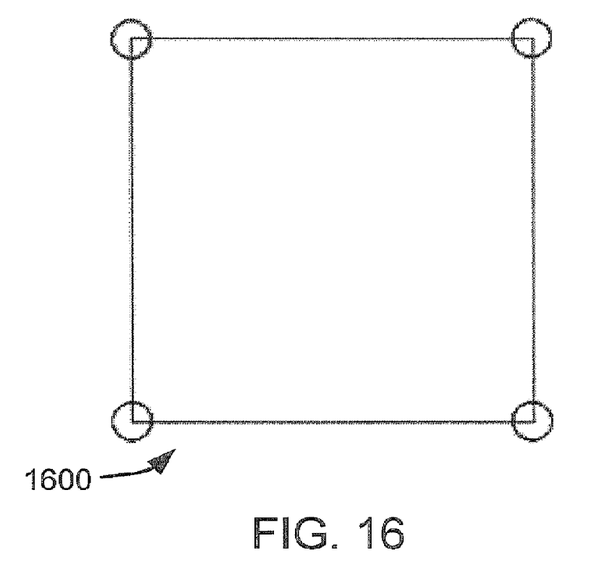
FIG. 16 is a diagram of four-point orientation for docking modules.

Referring now to FIG. 16, therein is shown a four-point orientation 1600. The docking module 100 shown in FIG. 1 is located in each corner of the four-point orientation 1600. In this configuration, docking possibilities of 0-degree, 90-degree, and 180-degree docking orientations are achievable. The four-point orientation can be square or rectangular depending upon the particular test head 800 being used.

Figure 17:
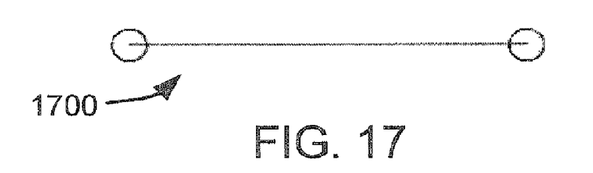
FIG. 17 is a diagram of two-point orientation for docking modules.

Referring now to FIG. 17, therein is shown a two-point orientation 1700. The test module 100 shown in FIG. 1 is located at each point of the two-point orientation 1700. The two-point orientation provides less freedom than the four-point orientation shown in FIG. 16. The two-point orientation 1700 is useful under conditions in which the test head is small and/or the device testing is less extensive. The two-point orientation 1700 may be desirable where high device throughput, speed of test setup, and the like are of importance.

Figure 18:
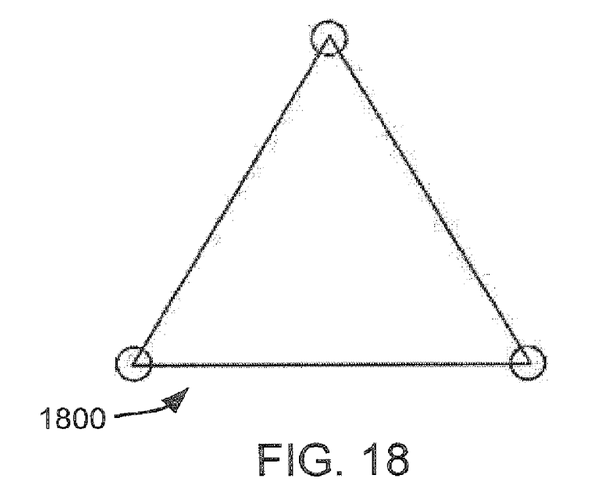
FIG. 18 is a diagram of three-point orientation for docking modules.

Referring now to FIG. 18, therein is shown a three-point orientation 1800. The test module 100 shown in FIG. 1 is located at each point of the three-point orientation 1800. The three-point orientation provides less freedom than the four-point orientation shown in FIG. 16. The three-point orientation 1800 is useful under conditions in which the test head is small and/or the device testing is less extensive. The three-point orientation 1800 may be desirable where high device throughput, speed of test setup, and the like are of importance.

Figure 19:
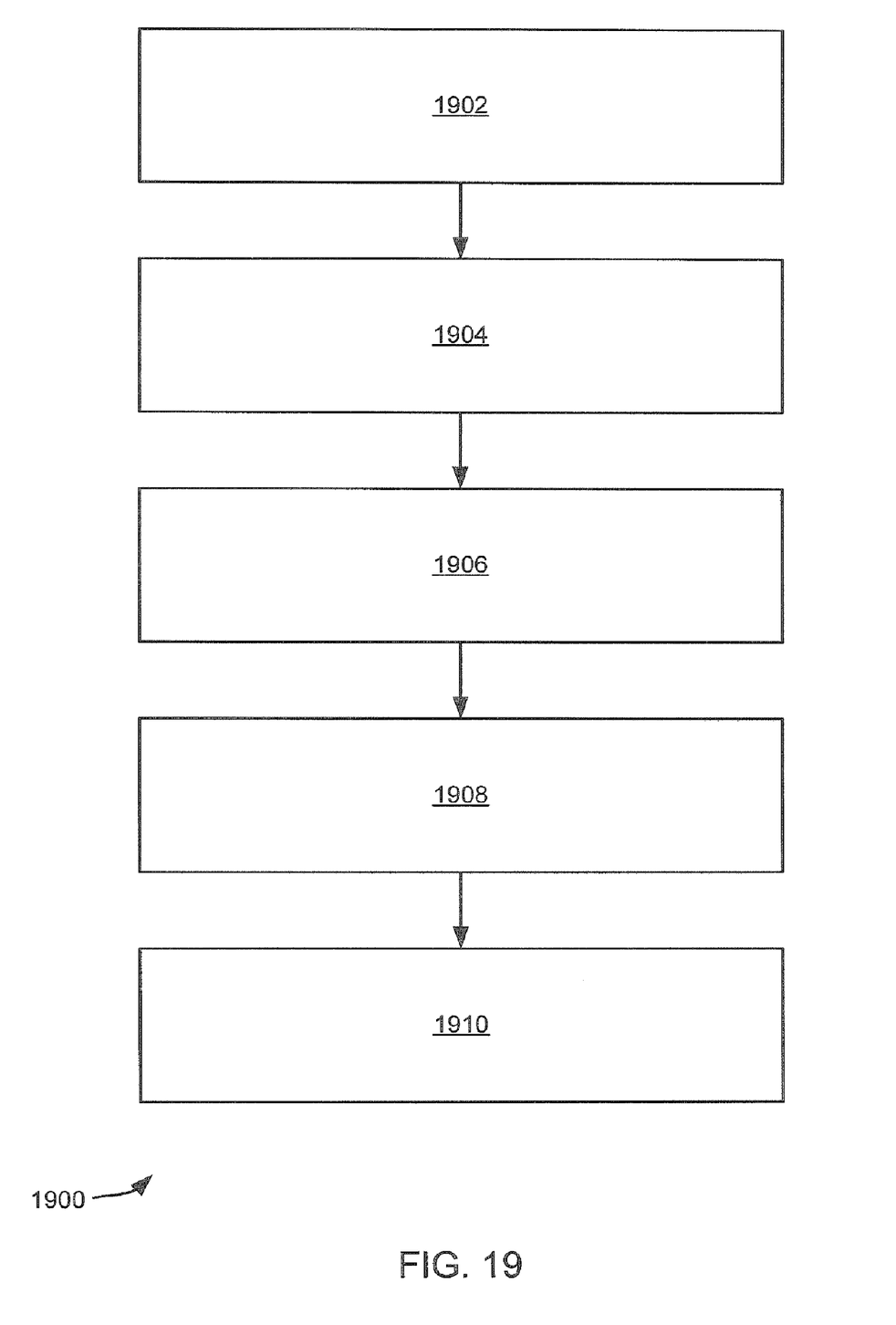
FIG. 19 is a flow chart of a system for testing an electrical device in accordance with the present invention.

Referring now to FIG. 19, therein is shown a flow chart of a method 1900 of docking a device handler for an electrical device with a test head in accordance with the present invention. The method 1900 includes providing a device handler for holding the electrical device, the device handler having a plurality of docking pins in a block 1902; providing a test head having a plurality of docking modules mounted thereon in a block 1904; aligning the plurality of docking pins with the plurality of docking modules in a block 1906; inserting the plurality of docking pins into the plurality of docking modules in a block 1908; and securing the plurality of docking pins in the plurality of docking modules in a docked position to connect the device handler to the test head in a block 1910.

Thus, it has been discovered that the docking system of the present invention furnishes important and heretofore unavailable solutions, capabilities, and functional advantages for positioning and docking a device handler to a test head in electronic device testing. The number of docking pin can be varied as can the number of docking modules. The method and process of the invention can thus be applied to a large surface where such an application is of benefit. Increasing the number of docking pins and docking modules also result in increased accuracy of alignment and in increased stability of the test assembly in the docking condition.

The present invention quickly and reliably positions and interlocks a handler plate with respect to a test head.

The present invention provides a system for establishing quick and reliable connections between an electrical device handler and an electrical device test head.

The present invention reduces the negative effect on device yield caused by unreliable interconnection between an electrical device handler and an electrical device test head.

The present invention reduces the need for device re-testing due to unreliable testing results caused by unreliable electrical device handler to electrical device test head connections.

The present invention reduces the downtime required for changing test equipment set-up in electrical device testing and manufacturing environments.

The present invention provides a simple yet flexible docking interface to reduce changeover parts inventory and set-up downtime. The resulting process and configurations are straightforward, economical, uncomplicated, highly versatile, and effective, use conventional technologies, and are thus readily suited for manufacturing ICs that are fully compatible with conventional manufacturing processes and technologies.

It is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for docking a device handler for an electrical device with a test head, comprising:
   providing a device handler for holding the electrical device, the device handler having a plurality of docking pins;
   providing a test head having a plurality of docking modules mounted comprises:
      providing a plurality of docking modules having a collet for grasping the docking pin; and
      providing a means for collapsing the collet around the docking pin;
   aligning the plurality of docking pins with the plurality of docking modules;
   inserting the plurality of docking pins into the plurality of docking modules; and
   securing the plurality of docking pins in the plurality of docking modules in a docked position to connect the device handler to the test head.

2. The method as claimed in claim 1, wherein:
   providing a device handler having a plurality of docking pins provides a plurality of docking pins having a pilot diameter and a locating diameter; and
   inserting the plurality of docking pins into the plurality of docking modules, further comprises:
   inserting the pilot diameter of the plurality of docking pins into the plurality of docking modules to position the device handler with respect to the test head; and
   inserting the locating diameter of the plurality of docking pins into the plurality of docking modules; and
   securing the plurality of docking pins in the plurality of docking modules in a docked position secures the pilot diameter of the plurality of docking pins.

3. The method as claimed in claim 1, wherein:
   providing a device handler having a plurality of docking pins, further comprises:
   providing a main handler plate;
   providing a plurality of pitching plates positioned in the main handler plate; and
   attaching the plurality of docking pins to the plurality of pitching plates.

4. The method as claimed in claim 1, wherein:
   securing the plurality of docking pins in the plurality of docking modules in a docked position further comprises:
   substantially simultaneously securing the plurality of docking pins in the plurality of docking modules.

5. A method for docking a device handler for an electrical device with a test head, comprising:
   providing a main handler plate having a handler electrical contact for holding the electrical device;
   providing a plurality of pitching plates attached to the main handler plate;
   attaching a plurality of docking pins to the plurality of pitching plates;
   providing a test head having a test head electrical contact that connects to the handler electrical contact comprises:
      providing a plurality of docking modules having a collet for grasping the docking pin; and
      providing a means for collapsing the collet around the docking pin;
   attaching a plurality of docking modules to the test head;
   aligning the plurality of docking pins with the plurality of docking modules;
   inserting the plurality of docking pins into the plurality of docking modules whereby the handler electrical contact connects to the test head electrical contact; and
   securing the plurality of docking pins in the plurality of docking modules in a docked position to connect the device handler to the test head.

6. The method as claimed in claim 5, wherein:
   attaching a plurality of docking pins to the plurality of pitching plates attaches a plurality of docking pins having a pilot diameter and a locating diameter; and
   inserting the plurality of docking pins into the plurality of docking modules, further comprises:
   inserting the pilot diameter of the plurality of docking pins into the plurality of docking modules to position the device handler with respect to the test head; and
   inserting the locating diameter of the plurality of docking pins into the plurality of docking modules; and
   securing the plurality of docking pins in the plurality of docking modules in a docked position secures the pilot diameter of the plurality of docking pins.

7. The method as claimed in claim 5, wherein:
   providing a plurality of pitching plates attached to the device handler provides a plurality of pitching plates having a plurality of pitching holes, wherein:
   associated ones of the plurality of pitching holes in a group of pitching plates define a set-up location for the plurality of docking pins.

8. The method as claimed in claim 5, wherein:
   securing the plurality of docking pins in the plurality of docking modules in a docked position further comprises:
   substantially simultaneously securing the plurality of docking pins in the plurality of docking modules.

* * * * *